United States Patent [19]

Konicek et al.

[11] Patent Number: 4,680,704

[45] Date of Patent: Jul. 14, 1987

[54] OPTICAL SENSOR APPARATUS AND METHOD FOR REMOTELY MONITORING A UTILITY METER OR THE LIKE

[75] Inventors: Lawrence R. Konicek, Richfield; Steven K. Case, St. Louis Park; Gerald M. Kackman, St. Paul, all of Minn.

[73] Assignee: TeleMeter Corporation, Minneapolis, Minn.

[21] Appl. No.: 687,089

[22] Filed: Dec. 28, 1984

[51] Int. Cl.$^4$ .................. G01B 11/2; G01R 11/00; G01K 9/00

[52] U.S. Cl. .................. 364/525; 250/231 SE; 324/157; 340/870.02; 340/870.29; 358/107; 364/516; 382/1

[58] Field of Search .................. 340/870.02, 870.28, 340/870.29, 688; 364/525, 483, 516; 250/231 SE; 356/71, 138, 141, 150, 152; 382/1, 65; 324/157; 377/17; 358/93, 107

[56] References Cited

U.S. PATENT DOCUMENTS

| Re. 27,728 | 8/1973 | Kosker et al. | 340/870.29 |
|---|---|---|---|
| 3,006,712 | 10/1961 | Eichacker | 346/14 |
| 3,054,095 | 9/1962 | Heller | 340/184 |
| 3,197,752 | 7/1965 | Rabinow | 340/206 |
| 3,214,766 | 10/1965 | Baker et al. | 346/95 |
| 3,307,164 | 2/1967 | Zimmer | 340/195 |
| 3,500,365 | 3/1970 | Cain | 340/196 |
| 3,503,044 | 3/1970 | Bonyhard et al. | 340/150 |
| 3,503,061 | 3/1972 | Bray et al. | 340/180 |
| 3,508,003 | 4/1970 | Moyers | 179/2 |
| 3,706,086 | 12/1972 | Farnsworth | 340/180 |
| 3,842,208 | 10/1974 | Paraskevakos | 179/5 R |
| 3,842,268 | 10/1974 | Cornell | 250/231 SE |
| 3,845,377 | 10/1974 | Shimotori | 318/662 |
| 3,846,788 | 11/1974 | Calabro et al. | 340/347 P |
| 3,852,726 | 12/1974 | Romanelli | 340/188 R |
| 3,922,490 | 11/1975 | Pettis | 179/2 A |
| 4,007,454 | 2/1977 | Cain et al. | 340/200 |
| 4,037,219 | 7/1977 | Lewis | 340/204 |
| 4,041,483 | 8/1977 | Groff | 340/347 P |
| 4,086,434 | 4/1978 | Bocchi | 179/2 AM |
| 4,104,486 | 8/1978 | Martin et al. | 179/2 AM |
| 4,137,451 | 1/1979 | Einolf, Jr. | 250/231 SE |
| 4,138,608 | 2/1979 | Brugger et al. | 235/92 FL |
| 4,213,119 | 7/1980 | Ward et al. | 340/870.02 |
| 4,227,148 | 10/1980 | Smith | 324/115 |
| 4,241,237 | 12/1980 | Paraskevakos et al. | 179/2 AM |
| 4,327,362 | 4/1982 | Hoss | 340/870.02 |
| 4,424,588 | 1/1984 | Satoh et al. | 364/516 |
| 4,556,844 | 12/1985 | Wasoh | 340/870.02 |

FOREIGN PATENT DOCUMENTS 2099260 5/1982 United Kingdom .

OTHER PUBLICATIONS

Brochure by Micron Technology, Inc. on an IS32 Optic RAM Solid-State Image Sensor.
Article for BYTE Publications Inc., Sep. 1983, by Steve Ciarcia Regarding a Micro D-Cam Solid-State Video Camera.

Primary Examiner—Parshotam S. Lall
Assistant Examiner—Daniel W. Juffernbruch
Attorney, Agent, or Firm—Merchant, Gould, Smith, Edell, Welter & Schmidt

[57] ABSTRACT

The present invention relates to an optical sensor apparatus (21) for remotely monitoring a utility meter or the like. The optical sensor apparatus (21) includes optically sensitive detector, in this case, a dynamic RAM device (40) which consists of an array (42, 44) of light sensitive elements. Light from a light source (56) is reflected off the faceplate (52) of the meter. Microprocessor control system (100) operatively interconnected to the optically sensitive dynamic RAM device (40) controls the exposure of the RAM device (40) to the light. The microprocessor control system (100) further determines the angular position of the individual pointer members (50) of the meter by correlating a binary image stored in memory to a predetermined geometic shape. The microprocessor control system (100) further includes logic for converting the angular positions of the pointer members (50) of the meter stages to a decimal value representative of the meter reading. A transmitter device is operatively interconnected to the microprocessor control system (100) for transmitting the decimal values to a remote site.

20 Claims, 17 Drawing Figures

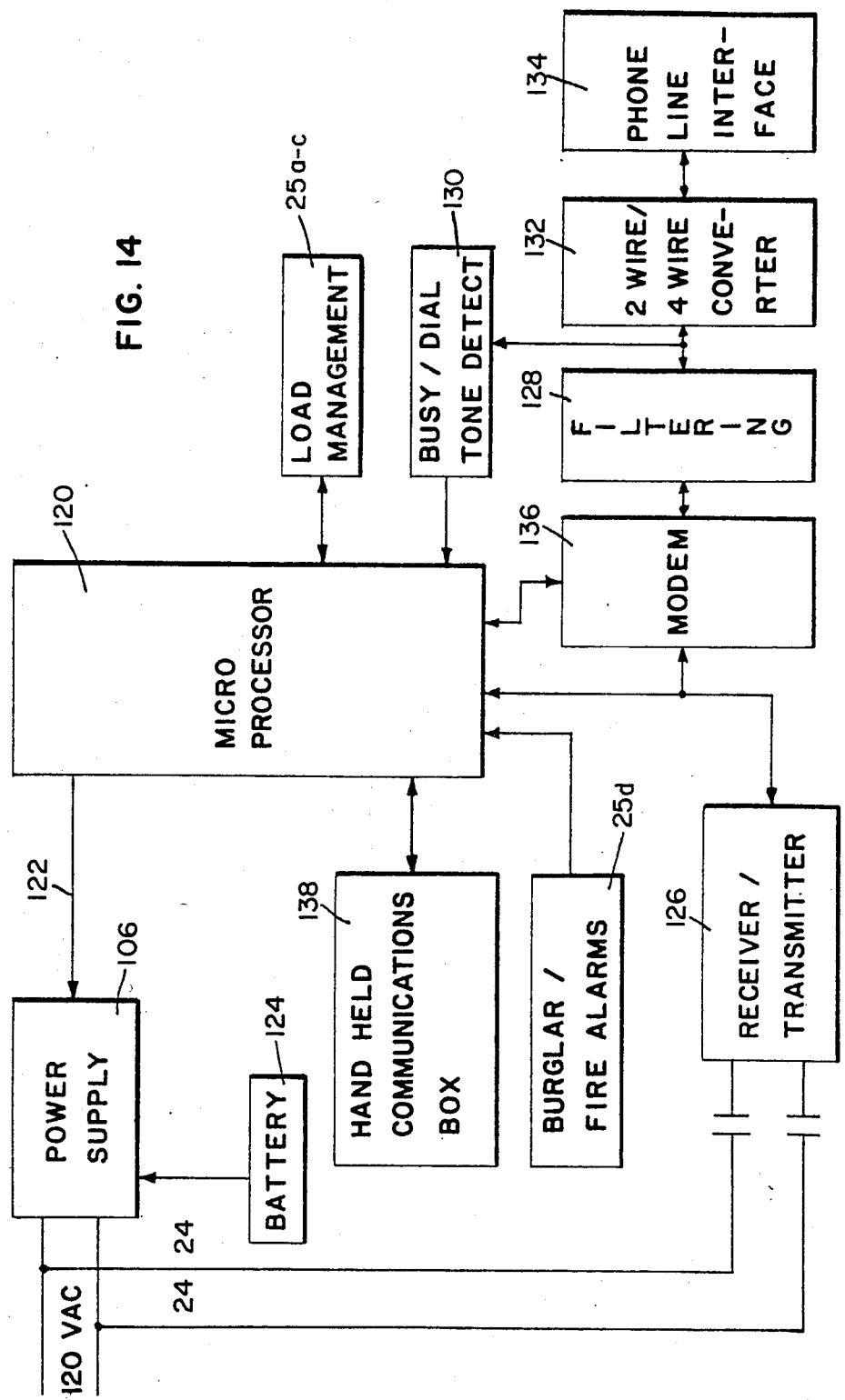

OPTICAL SENSOR APPARATUS AND METHOD FOR REMOTELY MONITORING A UTILITY METER OR THE LIKE

BACKGROUND OF THE INVENTION

The present invention relates generally to an optical sensor apparatus and method for remotely monitoring a utility meter or the like and transmitting the readout therefrom to a central location. More particularly, the present invention relates to an optical sensor apparatus and method for remotely monitoring a utility meter or the like by use of an optically sensitive, dynamic RAM (random-access read/write memory) device.

Electric, gas, water or other meters are typically characterized by a plurality of rotatable gears or shafts which are so interrelated that each successive shaft is angularly diplaced on a 10 to 1 basis with respect to its neighbor, whereby a direct decimal readout of the meter is enabled by means of indicator pointers which rotate with the several shafts about dials on a faceplate. In a typical power utility installation, for example, periodic reading of the meter is conducted by an individual who inspects the readings at each of the plurality of dials associated with the several shafts of the multistage meter, and thereby may record a direct decimal value.

Within recent years a considerable amount of interest has been generated in automating the readout function of the multistage or "polydecade" meter, as generally described above. Among the reasons that may be cited for such interest is a desire to reduce the cost of manual servicing, and the fact that the meters sought to be read are often in relatively inaccessible places in homes, in factories and in other installations. Moreover, interest is largely centered in providing an automated readout in such a form that said readout may be directly transmitted as, for example, by conventional transmission lines to the utility company or other provider of the services recorded on the meter. Such a result would not only vastly increase the efficiency and speed with which the meter readout process may be available to suppliers, but moreover provides as desired a virtually continuous capability for obtaining such information.

There has been considerable effort expended in providing means and apparatus for reading meters at a distance, for example, through telephone lines and the like. Most of such previous meter readings have required that some internal mechanical or electrical alteration be made to the meter itself, and considerable time and expense is required in putting the altered meter into use. In addition, when such alteration is performed there is the possibility of voiding the meter manufacturer's warranty. Many previous meter reading devices utilize sliding electrical contacts which has prevented their use in explosive atmospheres. Furthermore, in many such metering devices, changes in the output signal have been noted due to the aging of the components which can change the mechanical and or electrical characteristics.

Other meter reading devices have used photoelectric cells, so that no mechanical connection is needed between the meter and the meter readout. However, these reading devices have not been satisfactory because a reliable source of light must be provided and the face of the photoelectric cell must be kept sufficiently clean so that the light impinging on the photoelectric cell will not be diminished sufficiently to give a false reading.

Furthermore, the data from these systems and many other systems is extremely volatile as they monitor the disk or rotor movement of the meter. Accordingly, any slight disruption or interruption in the monitoring process will result in a complete data loss requiring that the meter be inspected manually to obtain a new start-up reading.

As disclosed in U.S. Pat. No. 3,852,726, a magnetic pointer in cooperation with read switches is utilized to provide a digital signal representative of the analog-type meter reading. In addition to other problems, this patent does not provide for resolution of ambiguities that might result from positioning of the pointer directly between two read switches. Also, this patent only provides for a readout at the remote site.

The present invention solves these and many other problems associated with many remote meter monitoring devices.

SUMMARY OF THE INVENTION

The present invention relates to an optical sensor apparatus for reading a dial setting on a utility meter. The optical sensor apparatus includes light source means for providing a source of light and directing the same generally toward the dial on a faceplate of the meter. Reflective surface means is disposed proximate the faceplate of the meter for reflecting the light directed thereon by the light source means. Lens means is provided for focusing the light so reflected by the reflective surface means. Optically sensitive image detector means including a plurality of light sensitive elements is provided for receiving the light focused thereon by the lens means. Support means is provided for supporting the light source means, the lens means, and the optically sensitive image detector means relative to the faceplate of the meter. Control circuitry means is operatively interconnected to the image detector means, the control circuitry means including means for controlling the exposure of the image detector means to the focused light. The control circuitry means further including means for accessing each of the light sensitive elements of the image detector means and receiving a binary output signal from each of the light sensitive elements representative of the light intensity to which exposed and means for storing the binary output for each of the light sensitive elements in memory means whereby a binary image of the dial setting on the meter faceplate is stored. The control circuitry means further includes algorithm means for determining the dial setting of the meter by correlation of the binary image of the dial setting with a predetermined geometric shape and means for storing in memory means physical data representative of the dial setting.

In the present application, a particular optical detector means in the form of a dynamic RAM chip is used. Such a detector produces only a binary image consisting of either light or dark picture elements.

Although the current application describes the use of a binary detector, in particular a dynamic RAM component, it will be understood that CCD (charge coupled device) detectors, MOS (metal oxide semiconductor) detectors, or other analog detectors might be utilized in keeping with the principles of the present invention; however, suitable analog electronics are required for subjecting the analog signals of these detectors to a threshold analysis so as to produce a binary signal image of the inherently binary meter dial. However, such analog detectors are currently more costly to purchase and implement than the RAM detector described herein. Therefore, at this time, the RAM detector is the preferred approach and will be described in detail herein.

One manufacturer, Micron Technology, Inc., of Boise, Idaho, has recognized the potential of dynamic RAM (random-access read/write memory) chips as imaging sensors. Micron Technology, Inc. produces a dynamic 64k byte RAM chip that has its memory laid out in only two arrays, both of which are 256×128 cells as generally illustrated in FIG. 2 and sold under the name of IS32 OpticRAM. The IS32 OpticRAM (trademark of Micron Technology, Inc.) comes packaged with a see-through quartz lid. The dynamic RAM chip costs several times less than other image sensing chips such as charged coupled devices (CCD). The dynamic RAM chip has a spectral sensitivity that is generally the same as that of other silicon based light sensing media, although its bit-for-bit uniformity is not quite as good as CCDs.

Since the introduction of the transistor and the discovery that it is light sensitive, several types of solid state sensing arrays have been produced. Phototransistor arrays and charge-coupled device (CCD) arrays have traditionally been used for image sensing. The potential of random access memories (RAM's) as imaging sensors has been known almost since they were first produced, but their imminent acceptance as sensors is primarily due to their low cost. The low cost, in turn, is probably attributable to the ever increasing numbers of memories used in computers. The only difference between Micron Technology, Inc.'s standard 64K dynamic RAM's and the IS32 OpticRAM is the packaging. The sensor package allows light to reach the silicon array, while the standard RAM is in a black injection molded IC DIP (dual in-line package). The high volume sales of the standard packaged RAM have permitted Micron Technology, Inc. to offer the IS32 OpticRAM at substantially lower cost than any other solid state sensor array previously available. Any RAM manufacturer whose RAM elements are layed out in a suitable fashion (e.g. orthogonally) can provide a cheap digital imaging sensor.

The applicant has discovered the application of an image detector such as the IS32 OpticRAM in an optical sensor apparatus for accurately and remotely reading a utility meter or the like.

A particular advantage of the present invention is its accuracy. In many applications, the applicant has found that the optical sensor apparatus is capable of providing readings with 10 times the required accuracy.

The present invention is particularly advantageous as it provides for non-volatile monitoring of the meter. Most systems monitor the continuously moving rotor of the meter and are accordingly very volatile, since if the monitoring process is interrupted and data lost, then the meter must be manually read so as to provide a start-up figure or reading. The present invention converts the analog information of the rotating meter dials to digital information for transmission to a central site. Accordingly, if data is lost for whatever reason, another reading can be taken on demand or as required.

Yet another advantage of the present invention is its use of relatively low cost components. The cost to retrofit existing meters is very minimal.

In addition, the present invention utilizes largely proven technology which has a high reliability. The various parts of the present invention have a relatively long life time, many of the parts being sheltered from the weather by the meter glass cover and further being weather resistant.

The present invention minimizes the wiring and electrical installation required at each site. The preferred embodiment utilizes as its power source the power lines already present at the meter location.

The present invention will further provide operability at a wide range of temperatures and environmental conditions.

The optical sensor apparatus of the present invention, by use of an imaging detector or sensor, provides data on instantaneous readings at a remote site, whether the readings be for a polydecade dial, polydecade odometer, single-needle gauges, digital readouts or the like. Applications may include electric, water and gas utility metering, but may also include the reading of many other remote devices such as gauges measuring pressure and flow within pipelines.

These and various other advantages and features of novelty which characterize the invention are pointed out with particularity in the claims annexed hereto and forming a part hereof. However, for a better understanding of the invention, its advantages and objects attained by its use, reference should be had to the drawings which form a further part hereof, and to the accompanying descriptive matter, in which there is illustrated and described a preferred embodiment of the present invention.

BRIEF DESCRIPTION OF THE DRAWINGS

In the drawings, in which like reference numerals and letters indicate corresponding parts throughout the several views.

FIG. 14 is a block diagram of an embodiment of a control module of a remote meter monitoring system utilizing an optical sensor apparatus in accordance with the principles of the present invention;

DETAILED DESCRIPTION OF THE PREFERRED EMBODIMENT

Figure 1:
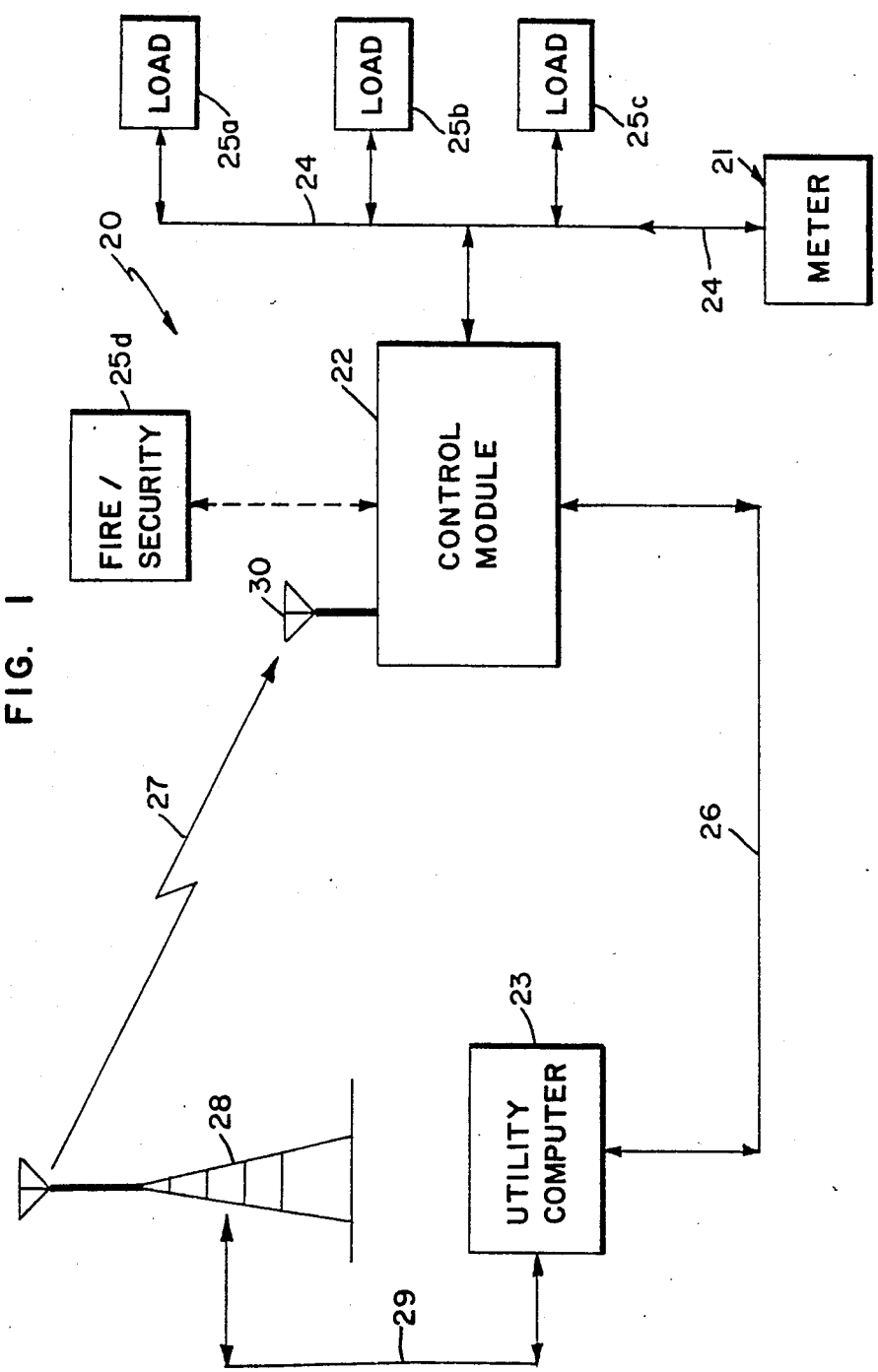
FIG. 1 is a block diagram of an embodiment of a remote meter monitoring system utilizing an optical sensor apparatus in accordance with the principles of the present invention.

Referring now to FIG. 1 of the drawings, a block diagram of an embodiment of a remote utility meter monitoring system utilizing an optical sensor apparatus in accordance with the principles of the present invention is disclosed, the system being generally designated by the reference numeral 20. The monitoring system 20 shown includes three major elements or subsystems; the optical sensor apparatus generally designated by the reference numeral 21, which is preferably mounted on the faceplate under the glass cover of an existing or newly installed meter for monitoring the movement of the dial pointers of a typical multistage meter; a control module, generally designated by the reference numeral 22, which is typically located inside the home or building where the meter is located and provides communication control between the optical sensor apparatus 21 and the utility company's computer, generally designated by the reference numeral 23, which forms the third major element of the system. In the embodiment shown, the control module 22 communicates over existing wiring 24 to the optical sensor apparatus 21, although this might be accomplished over specially installed cable, etc. As illustrated, the control module 22 might also provide communication to and control of, via the power lines 24, other utility devices 25a,b,c such as a fire/security system 25d. Two-way communication between the control module 22 and the utility company computer 23 is via existing telephone lines 26. An optional approach is to transfer data under/over voice transmission. As further illustrated, an alternate method of communication is via a one-way RF link 27. An FM broadcasting structure 28 or mobile land station interconnected to the utility company's computer 23 by conventional telephone lines 29 or dedicated lines providing for two-way communication, might be used to broadcast control signals to a receiver 30 at the control module 22 as required. The utility company's computer 23 might instruct the control module 22 to obtain meter readings on a periodic or demand basis as required. In addition, the control module 22 might be programmed to periodically obtain the meter readings and provide such information to the utility computer 23. The utility computer 23 might include a front end system for communicating with the control module 22 and obtaining the readout information. The front end system might then at a later time download the meter reading data into the utility company's main computer. For example, a front end system might include a microcomputer, such as an IBM PC, a modem, such as a Hayes Smartmodem, appropriate software, and supporting peripherals and communication lines. Of course, it will be appreciated that the meter reading data may be obtained by several different methods utilizing the principles of the present invention.

Figure 2:
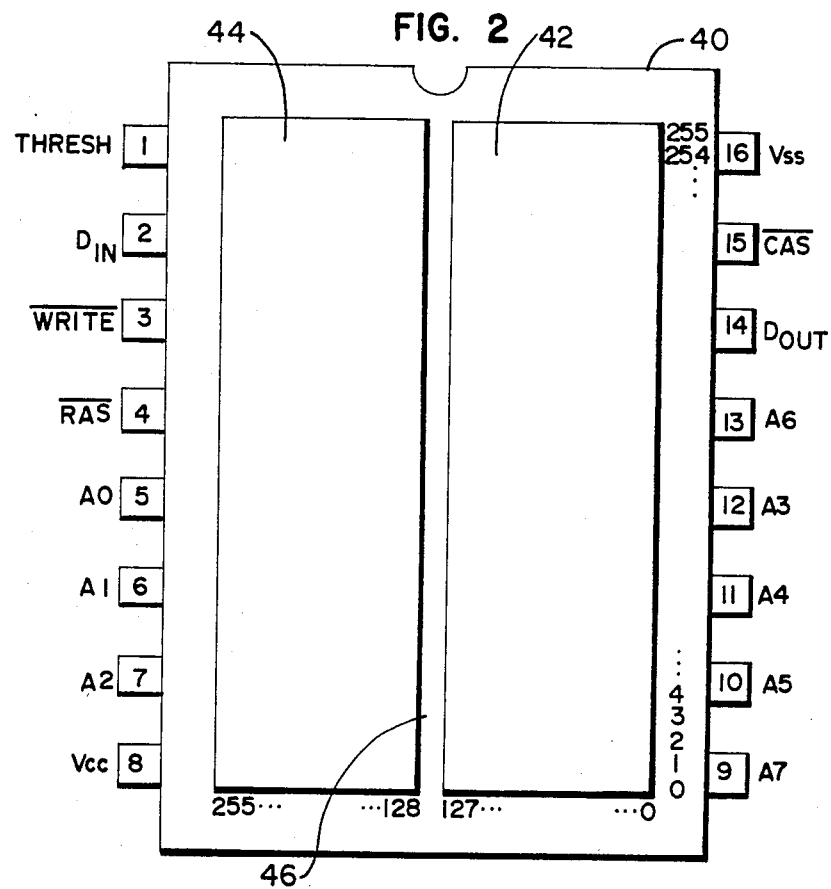
FIG. 2 is a diagrammatic top plan view of an embodiment of an optically sensitive dynamic RAM (random-access read/write memory) device utilized as an image detector in one embodiment of the optical sensor apparatus of the present invention.

In the preferred embodiment shown, the optical sensor apparatus 21 utilizes an optically sensitive dynamic RAM (randon-access read/write memory) device 40, an embodiment of which is illustrated in the top plan view of FIG. 2 as an image detector. In the preferred embodiment of the present invention, a dynamic RAM chip produced by Micron Technology, Inc. of Boise, Idaho and called the IS32 OpticRAM is utilized. As illustrated in FIG. 2, the RAM chip 40 has its light sensitive cells or elements laid out in two sections or arrays 42, 44, both of which are 256×128 cells as generally indicated by the row and column numbers shown in FIG. 2. As further illustrated in FIG. 2, the dynamic RAM chip typically comes configured in a 16 pin dual inline package, the pins being numbered 1 through 16 in FIG. 2. In the embodiment shown, pin 1 is normally interconneceted to a threshold voltage. The nominal threshold voltage is 2.1 volts, but typically can be adjusted from 1.5 volts to 3 volts. Pin number 2 serves as the input to the RAM chip 40 while pin number 14 serves as the output from the RAM chip 40. Pin number 3 receives the read/write signal while pin numbers 4 and 15 are interconnected so as to receive the row address strobe signal and the column address strobe signal, respectively, which are used by most dynamic RAM chips. Pin number 8 serves as input for Vcc (Vcc=4.5 to 5.5 volts) and pin number 16 serves as input for Vss. The voltage on Vcc supply relative to Vss is −1.0 volts to +7.0 volts. Pin numbers 5 through 7 and 9 through 13 serve as address inputs into the RAM chip 40.

The two rectangular arrays 42, 44 of light sensitive memory cells each include 32,768 elements. The two arrays 42, 44 are separated by an optically non-sensitive dead zone 46. To avoid having a gap in the image or to avoid having to use appropriate measures to eliminate it, only one of the arrays 42, 44 is typically used as an image sensor. The RAM chip 40 provides the optical sensor apparatus 21 of the present invention with digital image-sensing characteristics. The RAM chip is packaged with a see-through quartz or glass lid, as opposed to the opaque lid conventionally used in memory chips. In operation, light focused on the RAM chip 40 passes through the transparent lid and onto the light sensitive element arrays 42, 44. When an individual element is exposed to light the element acts like a capacitor which is initially pre-charged to a fixed threshold voltage, and begins to discharge. The element discharges at a rate proportional to the light intensity and duration of the exposure. After a predetermined exposure interval, the light sensitive elements are read by addressing them as memory cells. During the reading process, the element voltage value is sensed and compared to the fixed threshold voltage. If the voltage value is above the threshold value, the element is deemed to be black and the value of the output pin number 14 is set to one. If the voltage value of the light sensitive element is below the threshold voltage, the light sensitive element is deemed to be white and the output of pin number 14 is set to zero. As with other memory devices, the RAM chip 40 typically will require refreshing, wherein the voltage value of each of the light sensitive elements is sensed and brought back to the nominal voltage for the logic state (0 or 1) that it represents. This might happen when the internal computer reads a bit value from the light sensitive cell or more frequently, when circuitry external to the RAM chip 40 periodically activates the light sensitive elements for the purpose of refreshing. Typically, this will be accomplished a whole row at a time.

Using the RAM chip made by Micron Technology, Inc., in the beginning of an image sensing cycle control circuitry will address all the light sensitive cells in the array 42 or 44 which is being used, filling them with the positive voltages (roughly +5 volts) that represent logical ones. The exposure period will begin upon receipt of a predetermined command, which usually is equivalent to opening a shutter of a camera. After the appropriate exposure interval has elapsed, the control circuitry will issue the refresh command. Next the control circuitry will activate the interrupt state, at which time the voltage value of one light sensitive cell is read and transmitted. Repetitive interrupt cycles are continued until all of the light sensitive cells in the active array have been transmitted. The interrupt mode is not maintained constantly, since the dynamic RAM chip 40 cannot be refreshed during the interrupt cycle.

The faster the light sensitive elements in the active one of the arrays 42, 44 are read, the greater the light intensity required. While the control circuitry can scan approximately 15 frames per second at maximum speed, the actual scanning rate will vary depending on the light intensity.

Use of the dynamic RAM chip 40 thus provides for a digital image sensor. The image is focused on the plane of the active light sensitive element array 42 or 44. The user can adjust an aperture through which light is allowed to pass on its way to the light sensitive elements or the length of the exposure in an effort to obtain proper contrast for a good image of the object being viewed.

The applicant has discovered the utility of utilizing an optically sensitive dynamic RAM memory chip as an image detector element of an optical sensor apparatus for remotely monitoring dial pointer type utility meters. Although the specific application addressed in the specification relates to electric meters, it will be appreciated that the present invention can also be used for other applications.

Figure 3:
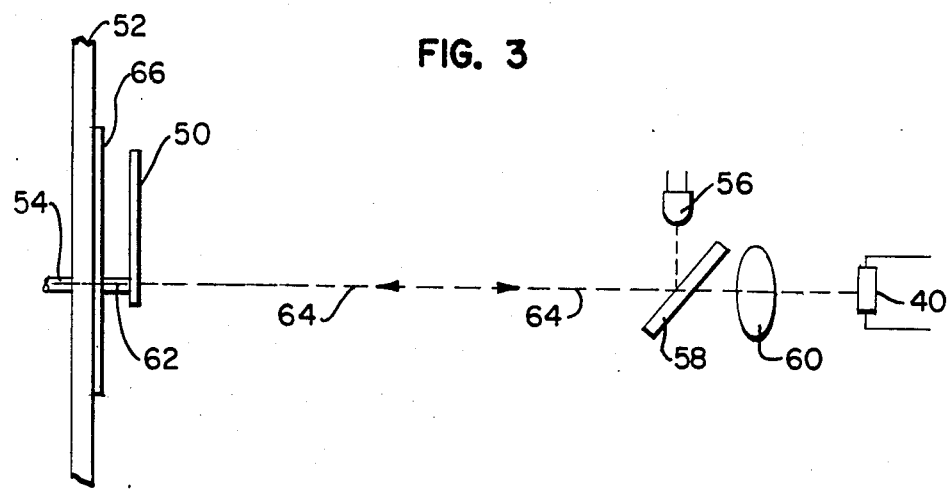
FIG. 3 is a partial diagrammatic, side elevational view of one embodiment of an optical sensor apparatus in accordance with the principles of the present invention illustrating relative geometrical arrangement of various ones of the sensor apparatus elements.

Diagrammatically illustrated in FIG. 3 is a geometric arrangement of various elements of one embodiment of the optical sensor apparatus relative to a pointer member 50 which is rotatably mounted on a meter faceplate 52 by an elongated shaft 54. The pointer member 50 is rotatably mounted for rotation about an axis of rotation 62. As illustrated in this embodiment, the optical sensor apparatus 21 in addition to the dynamic RAM chip 40 includes a light source 56 for providing a source of light, a light beam splitter apparatus 58 for partial reflection of the light, and a lens 60 for focusing the light onto the dynamic RAM chip 40. The embodiment illustrated in FIG. 3 does not provide for any folding of the optics with the exception that, as illustrated, the light source 56 is vertically displaced from the axis of rotation 62. The beam splitter apparatus 58 provides for approximately 50% reflection and is generally positioned in line with the axis of rotation 62. The beam splitter apparatus 58 is oriented generally at a 45 degree angle with respect to the axis of rotation 62, the side of the beam splitter apparatus 58 facing the pointer member 50 slanting upwardly and away from the pointer member 50. Accordingly, as illustrated, the beam splitter apparatus 58 reflects the light beam 64 at a 90 degree angle generally toward the meter faceplate 52. As further illustrated, a reflective surface 66 is preferably provided over the meter faceplate 52 in back of the pointer member 50. Preferably, a retroreflective surface is utilized such that the light will be reflected back in the same general direction from which it came. In a preferred embodiment of the present invention, the applicant has found retroreflective tape adhesively attached to the meter faceplate 52 to be very effective. Accordingly, the light beam 64 is reflected back toward the beam splitter apparatus 58, and roughly one-half of the light passes through the beam splitter apparatus 58 in line generally with the lens 60 which focuses the light on the light sensitive arrays 42, 44 of the dynamic RAM chip 40. Preferably, the retroreflective surface 66 exhibits a high optical efficiency in reflecting the light beam 64. Also preferably, the light source 56 and the lens 60 are equidistant from the beam splitter apparatus 58. The pointer 50 is preferably coated with or made from a light absorbing material so as to provide a contrast against the light being reflected from the retroreflective surface 66. In addition, the retroreflective surface 66 (although not shown) preferably includes an outline of the dial associated with the pointer member 50 and has the representative numeric markings indicated thereon so as to provide an image appearing very similar to that of the dials. In addition, the retroreflective surface 66 might have marked thereon in a recognizable bar code form 65 a unique ID of the particular meter being monitored so as to show up on the digital image generated at the dynamic RAM chip 40.

Use of a retroreflective surface or tape, in addition to efficiently returning the light from the light source back to the optical sensor apparatus, has the advantage of rejecting undesired light from the optical system. That is, stray ambient light such as that from the sun or other external sources is reflected back to that source and not into the optical sensor apparatus. In addition, although not shown, shrouds might also be used to block out ambient light as much as possible while still providing good visibility of the dial face for a user who might be performing a manual reading. It will be appreciated that there are alternate approaches to providing proper contrast. For example, the simplest approach might be to enclose the entire optical sensor apparatus and meter dials in a light-proof shroud. This would not allow direct viewing of the dials. A more acceptable approach is to make the controllable illumination much brighter than the ambient illumination, but this requires considerable power or a strobe system, which could be both annoying and costly. A third approach could utilize polarization or wavelength filtering, but such filters are expensive and reduce the efficiency of the system, requiring longer exposures or more light to get the same image.

A preferable approach is to locate the sources very close to the optical axis and place a retroreflector like Scotchlite (trademark of 3M Corporation) behind the pointer member 50. The retroreflector boosts the efficiency of the system, since the light emitted by the light sources 56 is principally sent back in the direction of the light sources (i.e., through the lens 60 and onto the image detector 40). Meanwhile, off-axis ambient illumination is sent back to its source and very little of it enters the lens 60 to get imaged onto the image detector 40. In addition, the two sources can be aimed slightly sideways (outwardly) to produce an illumination which is nearly uniform along the face of the dials. The contrast between the retroreflector and the pointer members 50 is exceptional, which allows additional latitude in the exposure and uniformity of illumination on the dials.

Another problem which is solved by the on-axis illumination is confusion of the image by shadowing. If an off-axis illumination is chosen, the shadow of the pointer can confuse the pattern recognition software.

Preferably, an infrared light source will be utilized. An infrared light source is preferred for several reasons, one of which is that good optical efficiency can be obtained with low power consumption. Furthermore, the dynamic RAM chip 40, while having a relatively broad band of sensitivity from roughly 200 nanometers to 1100 nannometers, is particularly efficient at the wavelength of infrared light, which is approximately 820 nannometers. In addition, the infrared light is invisible to humans so that customers and/or the casual observer will not call the utility company to complain that the utility meter has a problem, in that it is flashing. In addition, infrared light sources have relatively long lifetimes and can be obtained for relatively low cost; for example, infrared light emitting diodes (LED's). It will be appreciated, however, that other wavelengths of light might be utilized, for example, incandescent lights or xenon flashtubes. Furthermore, the applicant has found that in certain environments, the diffuse room illumination on a dial will produce an acceptable image on the image detector and in particular, the dynamic RAM device 40. However, a controlled source of illumination is preferred. The intensity and structure of external or "ambient" illumination is extremely unpredictable and should preferably be eliminated or overcome.

Preferably, the gap between the pointer member 50 and the dial face 52 is kept relatively slight to keep the shadow of the pointer at the same general location as the pointer itself and thereby not obstruct an accurate readout. While this is not particularly important for the geometrical arrangement illustrated in FIG. 3, it is more important in the geometric arrangements illustrated in FIGS. 6 through 8.

Figure 4:
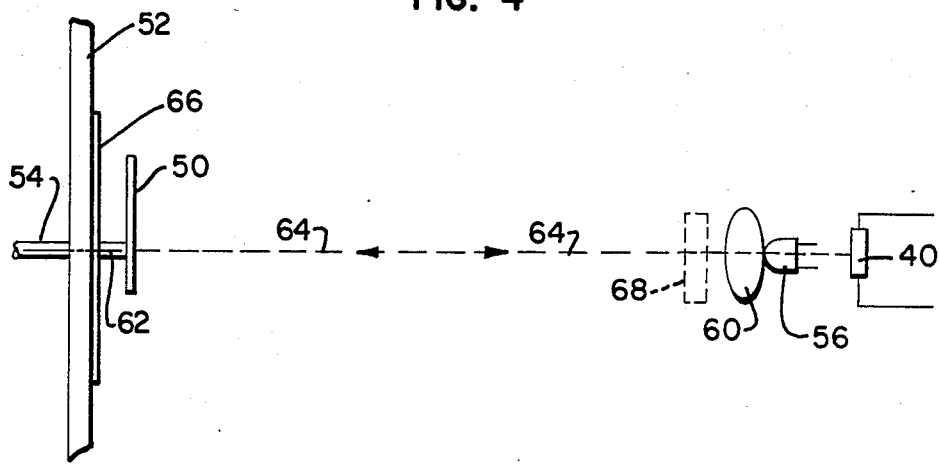
FIG. 4 is a partial diagrammatic, side elevational view of another embodiment of an optical sensor apparatus in accordance with the principles of the present invention illustrating the relative geometrical arrangement of various ones of the sensor apparatus elements.
Figure 5:
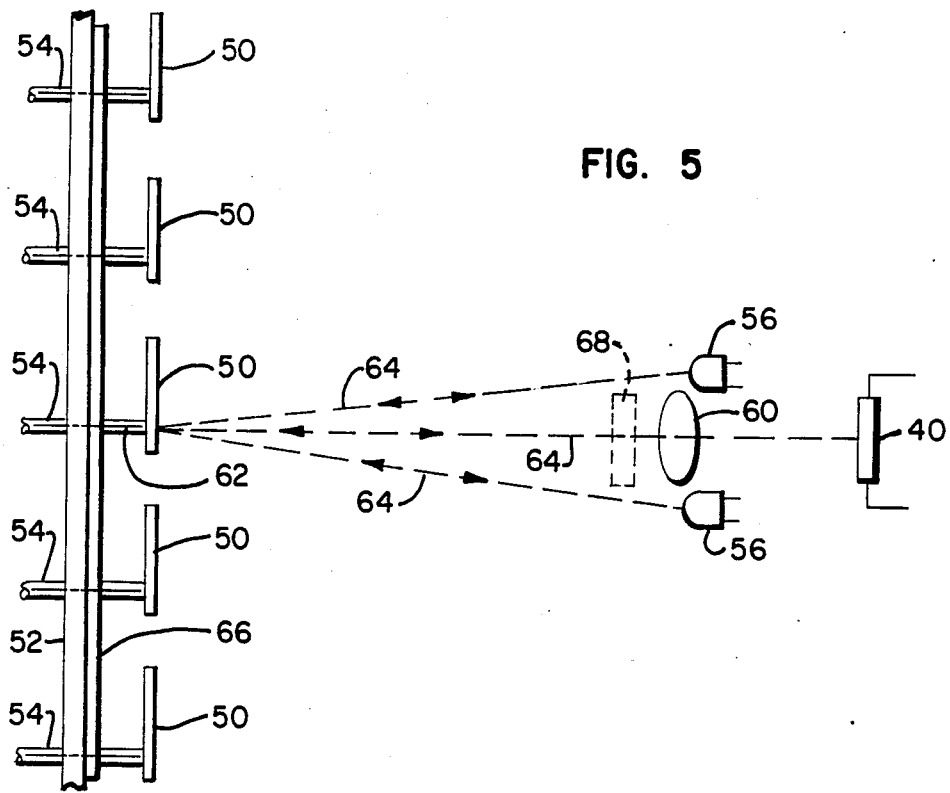
FIG. 5 is a partial diagrammatic, top plan view of the embodiment shown in FIG. 4.

In FIGS. 4 and 5 an alternate embodiment of the optical sensor apparatus is illustrated. In particular, the beam splitter apparatus 58 has been eliminated. The optical sensor apparatus 21 includes two of the infrared light sources 56, preferably infrared LEDs, horizontally aligned with the axis of rotation 62. The light sources 56 are horizontally displaced from the axis of rotation 62 with the lens 60 being in substantially direct alignment with the axis of rotation 62 of the center pointer member 50. As illustrated in FIG. 5, there will typically be a plurality of the pointer members 50, each mounted on its own rotatable shaft 54. In the embodiment shown in FIGS. 4 and 5, the lens 60 is generally aligned with the axis of rotation 62 of the middle pointer 50. Further illustrated by phantom line is an optional filter 68 directly aligned with the lens 60 and the axis of rotation 62 for filtering out visible light and transmitting infrared light. The filter 68 may also serve to filter out ambient light. The two LEDs 56 are placed as close to the lens 60 as practical. As the retroreflectors do not return the light exactly back to the source, but to areas very near the source, some light from the infrared LEDs 56 will enter the lens 60. (This has been distorted for purposes of illustration in FIG. 5 by the lines 64 representing the light beams.) A pair of LED's 56 is utilized since the area of the faceplate which must be illuminated is much longer in width than height. Once again, in the embodiment illustrated in FIGS. 4 and 5, no folding of the optics occurs.

Figure 6:
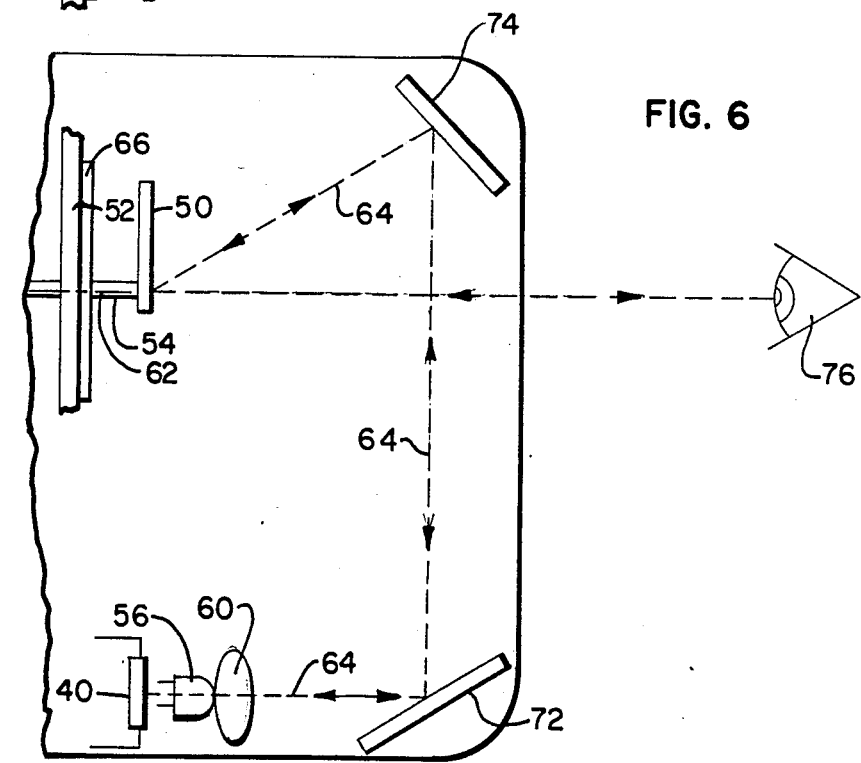
FIG. 6 is a partial diagrammatic, side elevational view of yet another embodiment of an optical sensor apparatus in accordance with the principles of the present invention illustrating the relative geometrical arrangement of various ones of the sensor apparatus elements.

Illustrated in FIG. 6 is a preferred embodiment which maximizes the path the light must travel between the faceplate and the lens while occupying minimal space such that the optical sensor apparatus will fit under a glass cover 70 of the utility meter. This is accomplished by the use of mirrors 72 and 74 to fold the optical path 64 so that it can be maximized but still enable the optical sensor apparatus to fit within a fairly small space and also allow viewing of the meter faceplate 52 by a user 76. The mirror 72 is located below the utility meter dials and is oriented at an angle of 45 degrees with respect to the vertical with the side of the mirror 72 facing the meter faceplate 52 extending generally upward and away from the meter faceplate 52. The mirror 74 is disposed above the meter dials and is in general vertical alignment with the mirror 72. The mirror 74 is similarly oriented at 45 degrees with respect to the vertical axis, the side of the mirror 74 facing the meter faceplate 52 extending downwardly and away from the meter faceplate 52. In the preferred embodiment of the present invention, the optics will be folded to enable positioning of the optical sensor elements under the glass cover of the meter while maximizing the light path traveled.

Figure 7:
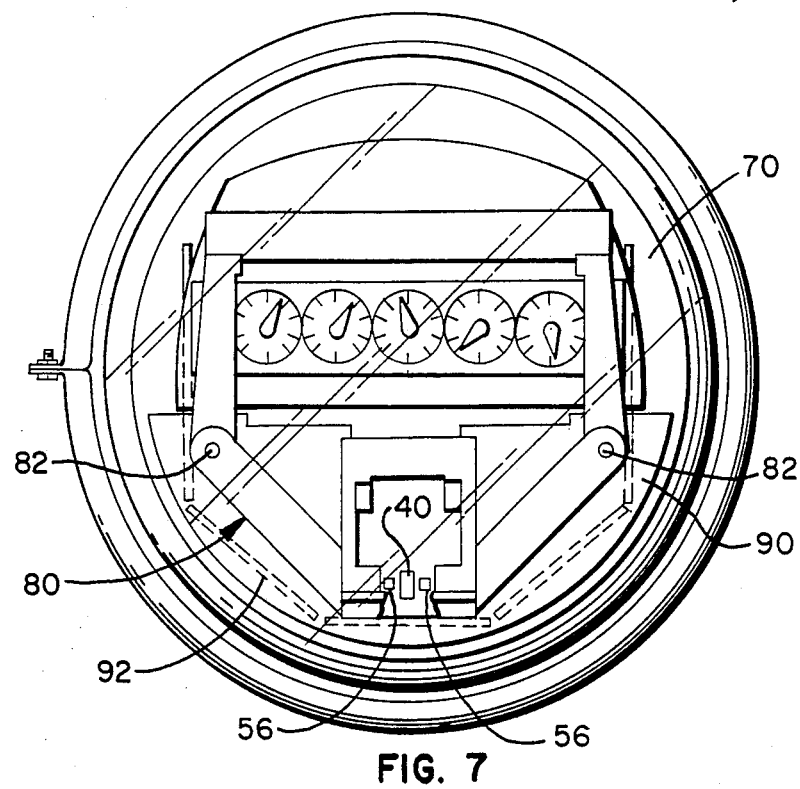
FIG. 7 is generally a top plan view of an embodiment of a mounting structure for mounting an embodiment of the optical sensor apparatus on a meter faceplate, the mounting apparatus providing for yet another geometrical arrangement of various ones of the sensor apparatus elements.
Figure 8:
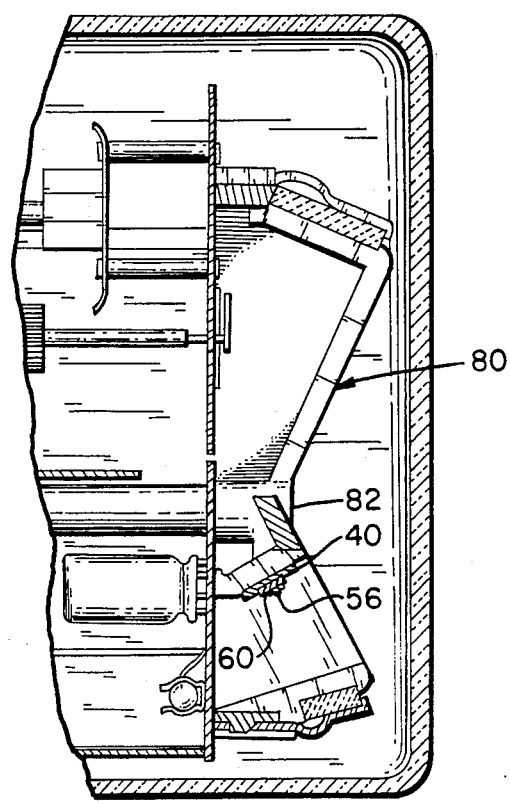
FIG. 8 is a cross-sectional view of the mounting structure illustrated in FIG. 7.
Figure 9:
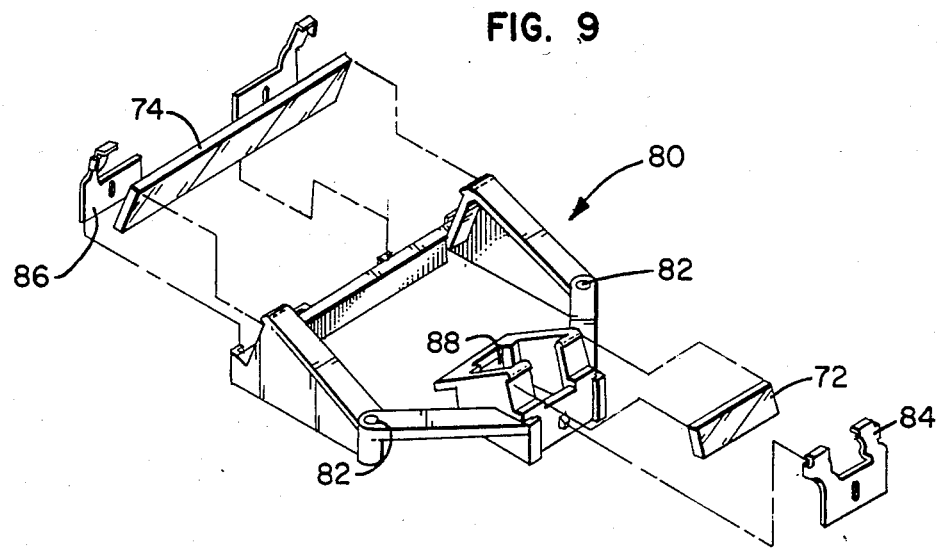
FIG. 9 is an exploded perspective view of the mounting structure illustrated in FIG. 7.

Illustrated in FIGS. 7–9 is an embodiment of a mounting structure mounting the optical sensor elements onto the faceplate of a meter under the glass cover 70. The glass covers typically found on utility meters have a depth of approximately three and one-half inches with a spacing of roughly one-half inch being provided between the meter faceplate 52 and the end of the cover. Although the mounting structure illustrated in FIGS. 7–9 substantially minimizes the space requirement for the sensor apparatus elements, the glass cover used with this embodiment must be extended approximately one inch. The support structure 80 is secured to the meter faceplate at locations 82. The mirrors 72 and 74 are removably mounted on the support structure 80 by snap-on bracket 84, 86 respectively, the image detector 40, lens 60, and light sources 56 being mounted roughly at location 88.

Figure 10:
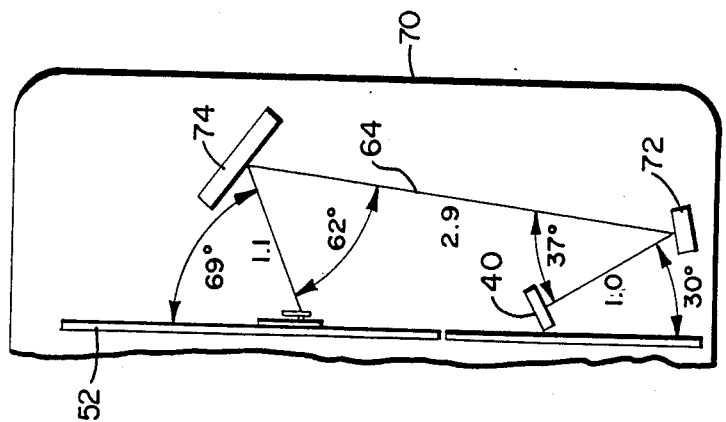
FIG. 10 is a partial diagrammatic, side elevational view illustrating a possible geometric arrangement of various ones of the sensor apparatus elements when mounted on a mounting structure similar to that illustrated in FIG. 7.
Figure 11:
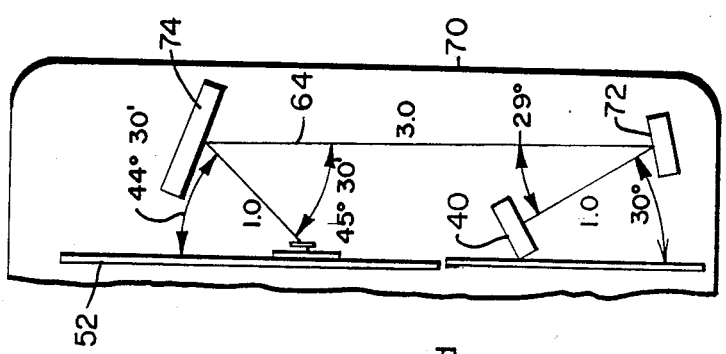
FIG. 11 is a view similar to FIG. 10 illustrating yet another possible geometric arrangement of various ones of the sensor apparatus elements when mounted on a mounting structure similar to that illustrated in FIG. 7.

It will be appreciated that the mirrors 72 and 74 provide for a folded optical path. The mirrors 72, 74 can have many differing orientations relative to one another and yet provide for optical folding. For example, illustrated in FIGS. 10 and 11 are two geometric views of possible mirror configurations, using a mounting structure very similar to that shown in FIGS. 7–9. As illustrated in FIG. 10, the mirror 72 is angled slightly more away from the mirror 74 such that the light beam 64 is directed further away from the meter faceplate 52. The approximate relative distances between the mirrors 72, 74 and the faceplate 52 is indicated in inches.

Figure 12:
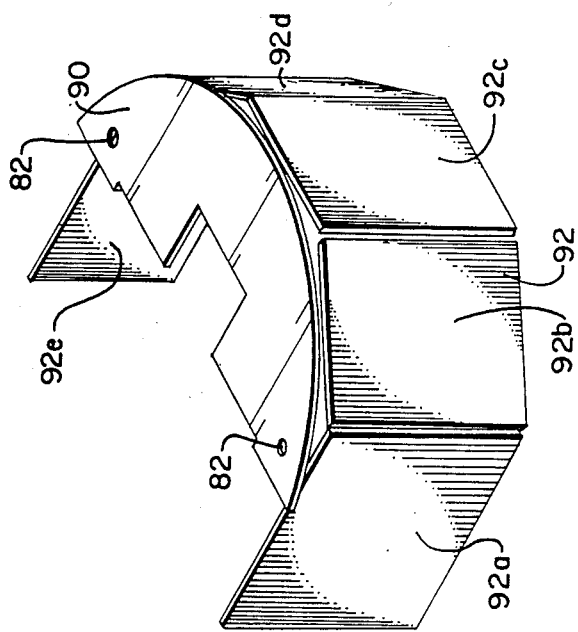
FIG. 12 is a perspective of an embodiment of a mounting structure for mounting control electronics of the optical sensor apparatus.

As illustrated in FIGS. 7-9 a support platform 90 extending generally parallel to the meter faceplate 52 might also be suitably secured to the meter faceplate 52 at locations 82. Extending about the periphery of the support platform 90 is another platform 92 which extends inwardly toward the meter. The platform 92 as illustrated in FIG. 12 might include a printed circuit board structure or the like scored or serrated so as to provide for five folded sections 92a-e wrapped about the periphery of the support platform 90. The platforms 90 and 92 provide for attachment thereto of the control circuitry provided for operation of the optical sensor apparatus and also for mounting of power supply elements as partially, diagrammatically illustrated in FIG. 8.

It will be appreciated that while in the preferred embodiment, the image detector is located under the glass cover 70, in alternate embodiments the image detector might be located outside of the glass cover.

Figure 13:
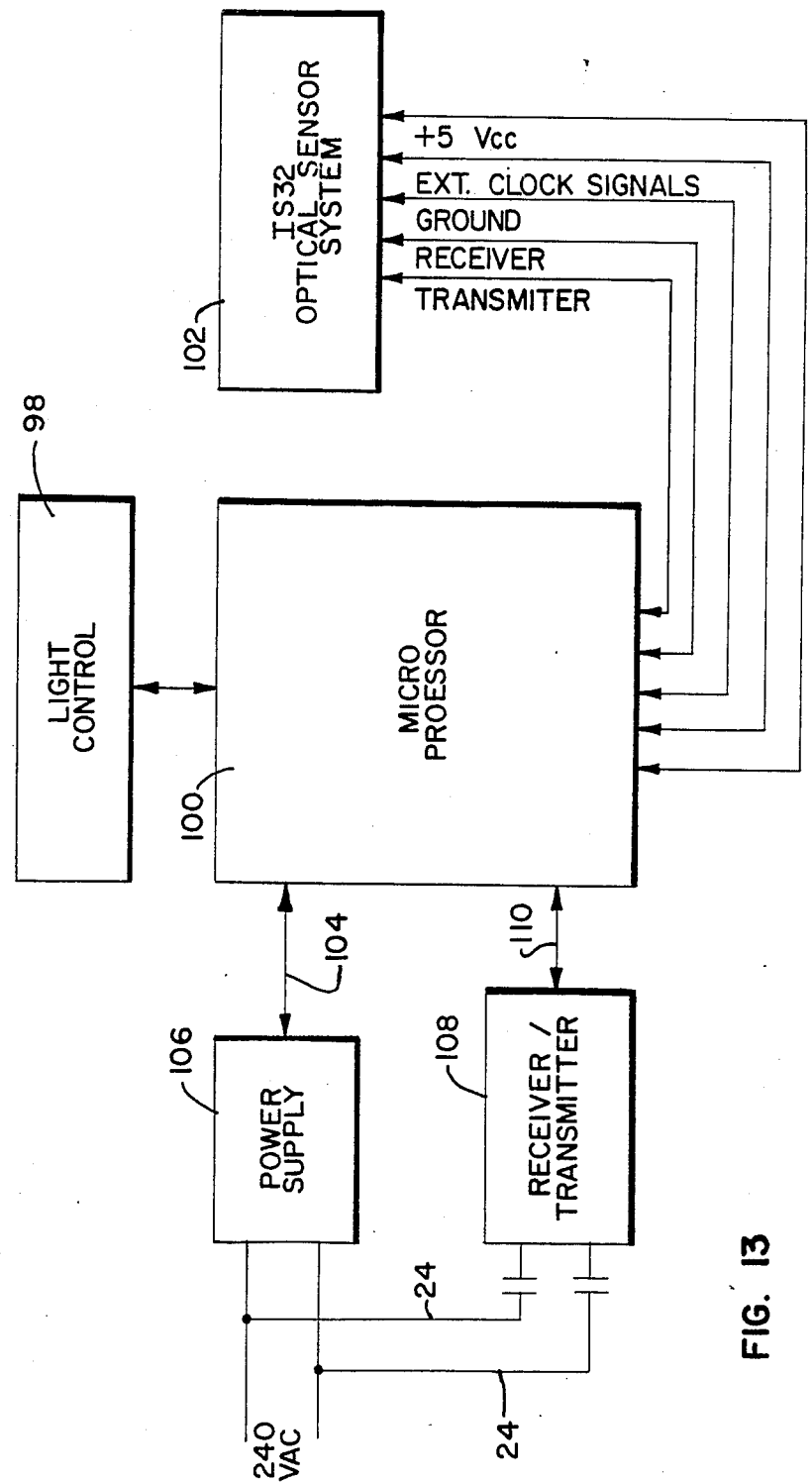
FIG. 13 is a block diagram of an embodiment of control electronics for an optical sensor apparatus in accordance with the principles of the present invention.

As previously discussed, a microprocessor-based system will preferably be utilized to support the dynamic RAM chip 40. The microprocessor-based system will include a microprocessor 100 interconnected to the control circuitry of the dynamic RAM chip, generally designated by the reference numeral 102 as illustrated in FIG. 13. The preferred embodiment of the electronics for the optical sensor apparatus is shown in FIG. 13. As discussed, the image detector used in the preferred embodiment is the IS32 OpticRam made by Micron Technology, Inc. of Boise, Idaho. It requires certain sequences of control signals and addresses to (a) clear the image space, (b) time the exposure of the RAM device, (c) keep the image static during readout, and (d) read out the image from the RAM device to the microprocessor data memory or directly to a serial power line communication (PLC) device. The control functions listed above can be accomplished using any of several circuits. In the electric meter, where package space is a concern, the functions will likely be implemented by an integrated custom circuit generally designated in FIG. 13 by the reference numberal 102. Micron Technology, Inc. provides schematics and hardware for a serial interface to the IS32 OpticRAM which provides a variety of functional commands to the users of their sensor. As illustrated in FIG. 13, only five lines will be required between the microprocessor and the control electronics 102; the lines carrying the transmit, receive, ground, external clock signals, and plus five volt power. The microprocessor 100 will include memory for program and data storage. A general purpose type synchronous communication interface adaptor can be utilized to perform the serial to parallel and parallel to serial data conversion required to interface the microprocessor 100 to the control electronics.

As further illustrated in FIG. 13, the microprocessor 100 will preferably be interconnected via leads 104 to the conventional 240 volt AC power supply 106 generally found at the meter location. The microprocessor in the preferred embodiment is interconnected to receiver/transmitter circuitry 108 via leads 110 for transmitting data and clock information on the existing wiring 24 to the control module 22. In the preferred embodiment, the microprocessor 100 will further be interconnected to suitable light source control circuitry 98 to provide control over the light source. It will be appreciated that the microprocessor system might take on any number of configurations in accordance with the principles of the present invention. In addition, the microprocessor might be interconnected to an existing meter sensor device such as a disk rotation sensor.

Illustrated in FIG. 14 is an embodiment of the control module 22 of the remote utility meter monitoring system shown in FIG. 1. The control module 22 might include a microprocessor 120 interconnected by wiring 122 to the conventional 240 volt AC power supply 106. The power supply 106 might be backed up by a battery 124. The microprocessor 120 might communicate via the existing wiring 24 with the optical sensor apparatus 21 by use of receiver/transmitter circuitry 126. As illustrated, a modem 136 along with appropriate filtering circuitry 128, busy dial tone detect circuitry 130, converter circuitry 132 and telephone line interface circuitry 134 is utilized to enable connection with the utility company's computer 23 over the telephone lines. It will be appreciated that these elements are off-the-shelf items and that indeed various configurations and arrangements might be utilized for controlling the optical sensor apparatus 21 and communication with the utility company's computer 23. As previously mentioned, the control module 22 illustrated in FIG. 14 might be interconnected to other utility devices, 25a-c to provide load management for regulating the utility load at the remote site. In addition, a hand held communications box 138 might be provided to enable a person at the remote site to obtain a reading for test sensor apparatus 21. Further, a previously indicated, the microprocessor 100 might be interconnected to other sensors or detectors such as burglar or fire alarms 25d.

Figure 15:
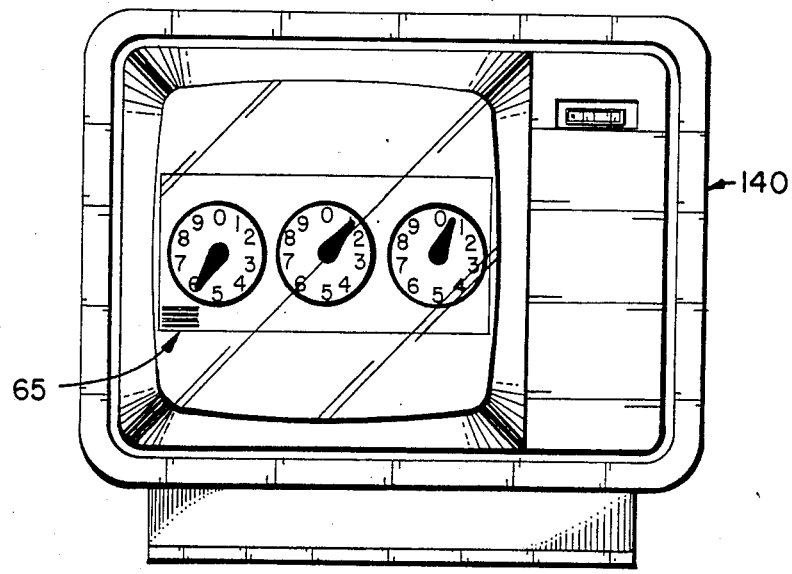
FIG. 15 is a diagrammatic view of a display presentation of a utility meter at a remote central site.

Although the binary image of the meter dials might be transmitted back to the utility company for viewing at a terminal 140 as generally illustrated in FIG. 15, in the preferred embodiment the microprocessor 100 is programmed to provide a digital readout of the meter reading. To apply the applicant's concept practically within the confines of an automatic meter reading system, some data compression within the optical sensor apparatus itself is preferred. Thus, in its normal mode of operation, the optical sensor apparatus would encode the enormous amount of information contained in the electronic binary image into a practical form, such as the five-digit reading in the case of the electric watthour meter. Although the system will preferably provide a means of obtaining the image at the remote optical sensor apparatus, only in rare circumstances would it be necessary or desirable to transmit the entire image from the optical sensor apparatus to a central device. Even when the entire image is to be transmitted, some a priori knowledge of the object being viewed can be applied to "compress" the binary image for transmission. In the case of the polydecade dials, the binary image is one contiguous white space with five black pointers on it. The outlines of the pointer members 50 can be determined by scanning for the leftmost edge and width of each pointer member along every line in the binary image. Each line of the image is thus compressed into ten numbers.

As illustrated in the preferred embodiment, the software will perform several tasks related to the meter reading function. In one task, the program determines the proper light intensity or exposure time to get a properly contrasted image. Proper exposure is determined by counting the fraction of light sensitive elements that are "on" in the image versus the number of those that are "off". The program includes a predetermined fractional value of the light sensitive elements that should be "on" or bright which is determined by comparing the known light area of the faceplate with that of the relative dark area of the pointer member and the numerals thereon. If the actual image does not have the proper fraction of light sensitive elements "on", another exposure is made and image captured using a different exposure time, threshold voltage or light intensity and the image is once again checked for proper exposure. In the preferred embodiment the exposure is controlled to within 3% of nominal by varying the exposure time between three milliseconds and five seconds. The process is continued until an acceptable image is obtained. For example, if the pointer members 50 are known to cover 15% of the image area, then the exposure should be adjusted to produce 85% illumination. Such a priori knowledge about the image can be obtained since meters are very similar and the magnification of the optics is fixed for a given meter style.

Figure 16:
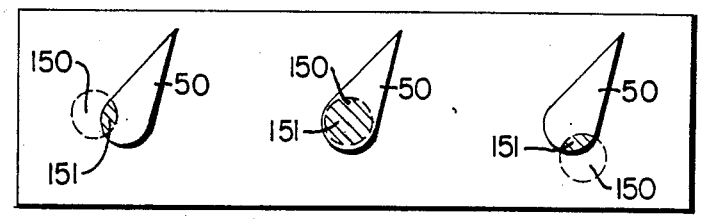
FIG. 16 is a diagrammatic view demonstrating a method for locating the axis of rotation of a pointer member on a meter faceplate.

A second task of the program is to determine the center position or axis of rotation of each of the dial pointer members 50. An advantage of using a binary image system with many independent sensors is that some assembly positioning tolerance is possible, in particular much more than is possible in a system with relatively few sensors. The exact position of the member on a binary image may not be initially known or may even change with time due to temperature, etc. The program will position a predetermined geometric figure 150, in the preferred embodiment a circle having a diameter roughly that of the diameter of the pointer center portion, at the proximate position of the pointer member center or axis of rotation and then calculate the correlation or match between the area of the geometric shape and the image of the tear drop shaped center portion of the pointer within that area. This is done by counting the number of pixels in the overlap area of the pointer member 50 and the circle 150. The sum of the pixels corresponds directly to the area of overlap and is an indication of how well the two shapes match. The process is generally illustrated in FIG. 16, wherein three different correlations are illustrated. The geometric shape is moved about until the best correlation is achieved. For example, in FIG. 16, maximum correlation between the geometric shape 150 and the pointer member 50 is shown in the middle correlation, shaded area 151 representing the correlation. In a preferred embodiment of the present invention, approximately 20 correlations are performed for each of the pointer members 50 to determine the position of maximum correlation. The center position of the circle 150 then indicates the position or axis of rotation of the pointer member 50.

Figure 17:
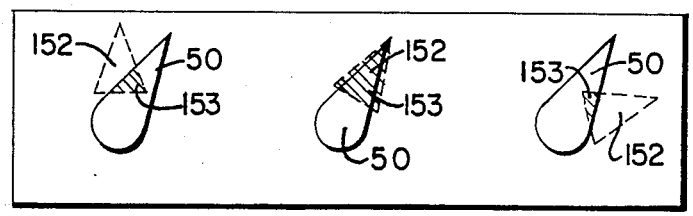
FIG. 17 is a diagrammatic view illustrating a method for locating the angular position of the pointer member on the meter faceplate.

Once the pointer member 50 has been located, the program will determine its angular position. Again, a predetermined geometric shape 152, in the preferred embodiment a triangle, is moved 360 degrees about the axis of rotation of the pointer member 50 to determine the maximum correlation. As illustrated in FIG. 17, maximum correlations will be obtained when the triangle 152 and the end of the pointer member 50 are roughly aligned. The position of maximum correlation provides the program with the angular position of the pointer member 50. In FIG. 17, maximum correlation is shown in the second of the three correlations, shaded area 153 representing the correlation.

It will be appreciated that the program can be readily adapted to recognize different patterns or geometric shapes.

In a fourth task, the angular position of the pointer member 50 is converted to decimal data. Knowledge of the angular position of the pointer member 50 and of the position of the numerals around a given dial (including the fact that adjacent dials on many meters rotate in opposite directions) enables conversion of an angular position to decimal numbers.

It will be appreciated that there are several different possible approaches and methods for analyzing and interpreting the binary image stored in memory, whether that binary image be of a polydecade meter, or an odometer, etc.

The software required to read odometer style meters is only slightly different from the pointer-searching software. The primary difference is that several more shapes are required. A template of an unrolled odometer is shifted over each dial with a result which is similar to rotating the triangle around the pointer on the dial meters. The best correlation location indicates the reading on that dial.

It should be noted that some (not all) odometer meters employ a racheting mechanism to move the odometer drums on the upper dials quickly through transitions. An interdial roundoff procedure would be unnecessary for these meters.

It would be possible to monitor digital display devices with the same apparatus (although it is not clear why one would need to digitally encode a device which is inherently digital). The principal applications of the optical sensor apparatus are for digitizing inherently analog devices . . . especially polydecade meters, but also many single-needle deflection-type devices.

The present invention typically provides readings with ten times the required accuracy; for example, 8.4 for a single dial reading. In the example given, the 0.4 indicates that the dial is 0.4 of the way between 8 and 9. As a check on the accuracy of the readout, the program of the preferred embodiment looks at the previous less significant dial read out. In one embodiment, if that readout is off by more than 2 from the fractional digit of the current dial's readout, a caution or error signal is generated and transmitted to the utility computer. For example, in the example given above, if the previous less significant dial had a reading of 7, an error signal would be generated. However, if the previous less significant dial had a reading of 5 no error signal would be generated. In this fashion, the entire set of dials on the meter are read and a decimal read-out provided back at the utility computer.

As illustrated in FIG. 15, in a preferred embodiment of the present invention, the meter ID will be placed as a standard UPC bar code pattern 154 on the dial face adjacent to the periphery of the dials and will be optically read with the optical sensor apparatus of the present invention. The meter ID is used to identify the meter which is providing the data. The ID is decoded whenever the system is powered up and the optical sensor apparatus at a particular meter will only respond to its unique ID.

As previously mentioned, the entire image of the meter dial face might be transmitted to the utility computer 23 as generally illustrated in FIG. 15. This is particularly helpful in those situations wherein erroneous or questionable readings have been detected and utility company personnel might want to directly view the meter tent to ascertain whether or not an erroneous reading has occured.

The principal problem with meter reading is conversion of an analog displacement (i.e. rotation of dials or odometers) into a digital reading. The required resolution of the digitizing process is ideally only slightly better than the interdial gear ratio. Thus, for a typical 10:1 gear ration, 1/11 revolution or better resolution is adequate. The need for "super-resolution" stems from aliasing problems in the interdial checking process.

Consider a decimal meter with 1/10 revolution resolution. Even if the reading system is ideal, the mechanics of the gear system can cause minute anomalies in the motion of any dial. This means that any resolvable interval (e.g. 1.0 to 2.0) is of indeterminant error (e.g. perhaps 0.999 to 2.001). Normal techniques of consulting the tenths (previous) dial may still lead to an ambiguous result (e.g. 0 on the next lower dial may indicate 1.0 or 2.0 as the correct reading).

If the resolution permits narrowing of the interval to the point that cyclic overlap of the tenths place does not occur, then a truly unambiguous reading may be obtained. Consider 1/11 resolution (e.g. an interval of 1.04 to 1.949 . . . ) with the same error margin (i.e. expanded interval of 1.039 to 1.9491 . . . ) A 0 (rounded from 0.0 to 0.99 . . . ) on the tenths (previous) dial definitely indicates that the correct reading on the higher dial is 1.0.

In the preferred embodiment of the present invention, the resolution is much better than 1/10. In fact, simple geometry will reveal that the circumference of a circle tracing the path of the pointer tip is 1.9 inches. On the IS32 OpticRAM, this path intercepts about 200 cells so the resolution is at least 1/100 revolution. It is feasable to derive a reading like 1.0 (where the zero is significant) and compare the digit past the decimal to the reading on the tenths (previous) dial. An error can be flagged if the discrepancy indicates the tenths pointer is pointing opposite from expected. A caution can be signalled if the error is less than half, but greater than some determined value. In the preferred embodiment, either condition (error or caution) may trigger transmission of the entire image to the utility company if requested.

The exact method for interdial checking in the preferred embodiment is as follows:
1. read the lowest dial and truncate the reading to an integer.
2. Read the next dial. Compare the fractional part of the reading (multiplied by ten) to the lower dial reading by subtracting the prior from the latter (modulo 10). A difference of four or five indicates an error. Three and six may produce cautionary error messages.
3. Before truncating the reading, subtract one tenth of the lower dial reading and add one half (modulo 10). This will accomplish the roundoff shown in Table 1.
4. Repeat 2 and 3, above, until done.

Even though numerous characteristics and advantages of the preferred embodiment of the invention have been set forth in the foregoing description together with details of the structure and function of the invention, the disclosure is illustrative only, and changes may be made in detail, especially in matters of shape, size and arrangement of parts, within the principles of the invention, to the full extent indicated by broad general meaning of the terms in which the appended claims are expressed.

What is claimed is:

1. An apparatus for optically sensing the angular position of a pointer member fixedly mounted on a rotatable shaft for rotational movement therewith about an axis of rotation, the apparatus comprising:
   a. an infrared light source means for providing a source of infrared light;
   b. mirror means cooperating with the infrared light source means for directing the infrared light generally toward the pointer member from a location generally forward of the pointer member;
   c. retroreflective surface means disposed on generally one of two locations selected from a faceplate in back of the pointer member and the pointer member for providing a contrast between the pointer member and the faceplate in back of the pointer member, the retroreflective surface means reflecting the infrared light generally back in the direction from which it came toward the mirror means;
   d. lens means for focusing the infrared light reflected by the retroreflective surface means;
   e. optically sensitive image detector means including an array of light sensitive elements for receiving the infrared light focused thereon by the lens means, the optically sensitive image detector means including control circuitry means for controlling the operation of the image detector means, the control circuitry means including:
      i. means for presetting each of the light sensitive elements to a predetermined voltage;
      ii. means for initiating the exposure of the light sensitive elements to the infrared light;
      iii. refreshing means for refreshing the light sensitive elements after a predetermined exposure interval wherein the voltage of each of the light sensitive elements is compared to a predetermined threshold voltage value and each of the light sensitive elements are provided with one of two nominal voltage values representative of the respective light sensitive elements having a voltage less than the threshold voltage value or greater than the threshold voltage value; and
      iv. means for reading the nominal voltage value of each of the light sensitive elements and providing a binary output signal representative of the nominal voltage value; and
   f. control means operatively interconnected to the image detector means for receiving the binary output signal and storing the binary output signal in memory means whereby a binary image of the pointer member is stored, the control means including:
      i. exposure control means for controlling the exposure of the image detector means to the infrared light;
      ii. location means for locating the axis of rotation of the pointer member, the location means including means for correlating the binary image of the pointer member stored in the memory means to a first predetermined geometric shape;
      iii. angular position means cooperating with the location means for determining the angular position of the pointer member, the angular position means including means for correlating the binary image of an end portion of the pointer member with a second geometric shape rotatable relative to the binary image of the pointer member about the axis of rotation of the pointer member; and iv. means for storing in memory means digital data representative of the angular position of the pointer member.

2. An apparatus in accordance with claim 1, wherein the mirror means includes beam splitter means for reflecting only a fraction of the infrared light directed thereon by the infrared light source.

3. An apparatus in accordance with claim 1, wherein the infrared light source means and the mirror means are offset from the axis of rotation of the pointer member, the mirror means cooperating with the infrared light source means for directing the infrared light generally toward the pointer member.

4. An apparatus in accordance with claim 1, wherein the infrared light source means is offset from the axis of rotation of the pointer member and directs the infrared light in a direction generally away from the pointer member, the mirror means including two separate, spaced apart mirrors for directing the infrared light first generally transversely of the faceplate and second generally toward the pointer member whereby the mirror means do not obstruct visual viewing of the pointer member.

5. An apparatus in accordance with claim 1, further including transmission means operatively interconnected to the microprocessor means for transmitting the digital data representative of the angular position of the pointer member to a remote location.

6. An apparatus in accordance with claim 1, wherein the control means includes means for converting the angular position data to numerical data.

7. An apparatus in accordance with claim 1, wherein the image detector means includes a dynamic RAM means.

8. An optical sensor apparatus for reading a meter having one or more dial settings representative of the meter reading; comprising:
   a. light source means for providing a source of light, the light source means directing the light generally toward a faceplate of the meter;
   b. reflecting means for providing contrast between operative parts of the meter by reflecting light received from the light source means;
   c. lens means for focusing the light reflected off the meter;
   d. optically sensitive image detector means including an array of light sensitive elements for receiving the light focused thereon by the lens means and retaining for a period of time a state indicative of the intensity of the light received; and
   e. control means operatively interconnected to the image detector means for receiving the output signals from the light detector means representative of the light intensity to which the light sensitive elements of the image detector means are exposed and for storing values represented by the output signals whereby a digitized image of the meter is stored, the control means including means for determining dial settings of the meter by interpretation of the digitized image stored in the memory means.

9. An apparatus in accordance with claim 8, wherein said control means includes pattern recognition means for comparing the digitized image to a predetermined pattern whose X-Y coordinates are known.

10. An apparatus in accordance with claim 8, further including transmission means operatively interconnected to the control means for transmitting the digitized image to to a remote location.

11. An apparatus in accordance with claim 8, further including transmission means operatively interconnected to the control means for transmitting the digital data representative of the dial settings to a remote location.

12. An optical sensor apparatus for remotely reading a multistage meter, each stage of the meter including a pointer member affixed to a rotatable shaft for rotation about an axis of rotation, adjacent pointer members being angularly displaced on a 10:1 ratio with respect to the pointer member of the next higher adjacent stage so as to record decimal readings and measurements, the optical sensor apparatus comprising:
   a. a support structure means for supporting at least some of the elements of the optical sensor apparatus on the meter under a transparent cover placed over the meter to enclose the stages;
   b. infrared light source means for providing a source of infrared light;
   c. mirror means for reflecting the infrared light generally toward a faceplate of the meter where the stages are positioned;
   d. retroreflective surface means disposed proximate the surface of the meter faceplate in back of the pointer members for reflecting the infrared light generally back toward the infrared light source means in the direction from which the light came, the pointer members reflecting less infrared light than the retroreflective surface means so as to provide an effective contrast therebetween;
   e. lens means for receiving the infrared light reflected from the retroreflective surface means and focusing the infrared light;
   f. optically sensitive dynamic RAM means including an array of individual light sensitive elements arranged in rows and columns for receiving the infrared light focused thereon by the lens means, each of the light sensitive elements providing a binary output signal having one of two binary values representative of the amount of light to which each of the individual light sensitive elements are exposed, a first value being representative of an exposure below a predetermined threshold value and a second value being representative of an exposure above a predetermined threshold value;
   g. control means operatively interconnected to the optically sensitive dynamic RAM means for receiving the binary output signals from the optically sensitive dynamic RAM means and for storing the binary values of the binary output signals in memory means whereby a binary image representative of the meter stages is stored in the memory means, the control means including:
      i. means for controlling the exposure of the optically sensitive dynamic RAM means to the infrared light;
      ii. means for determining the angular position of each of the individual pointers of the meter stages by correlating the binary image to predetermined geometric shape means;
      iii. means for converting the angular positions of the pointer members of the meter stages to numerical value representative of the meter reading; and
   h. transmission means operatively interconnected to the control means for transmitting the numerical value representative of the meter reading to a remote site.

13. An apparatus in accordance with claim 12, wherein the support structure means includes an integral support structure removably mounted onto the meter, the integral support structure supporting the infrared light source means, the lens means, the mirror means, and the optically sensitive dynamic RAM means under the transparent meter cover.

14. An apparatus in accordance with claim 13, wherein the integral support structure is removably mounted onto the faceplate of the meter by threaded fasteners cooperating with the existing threaded apertures of the meter faceplate.

15. An apparatus in accordance with claim 12, wherein the mirror means includes two spaced apart mirrors, a first mirror for reflecting infrared light received from the infrared light source in a direction generally transverse of the meter faceplate, the infrared light source means directing the infrared light generally toward the first mirror and generally away from the meter faceplate, and a second mirror for reflecting the infrared light received from the first mirror in a direction generally toward the meter faceplate.

16. An apparatus in accordance with claim 12, wherein the retroreflective surface means includes bar code indicia means for identifying the meter, and a microprocessor means including means for reading the bar code from the binary image stored in the memory means.

17. An apparatus in accordance with claim 12, wherein the means for detecting the angular position of each of the pointer members includes axis location means for detecting the location of the axis of rotation of each of the pointer members in the binary image stored in the memory means by correlating the binary image of each of the pointer members to a circular geometric shape whose center XY coordinates are known, the axis location means moving the circular geometric shape around by selecting different XY coordinates for the circular geometric shape and comparing the binary values of the binary image lying within the area of the circular geometric shape at each of the selected XY coordinates, the axis of rotation of the respective pointer members being determined as the XY coordinates of the circular shape wherein a maximum number of the binary values are found having the first binary value representative of an exposure below the threshold value, the means for detecting angular position further including angular position means for detecting the angular orientation of each of the pointer members with respect to their respective axis of rotation by correlating the binary image of each of the pointer members to a triangular geometric shape whose angular orientation relative to the axis of rotation is known, the angular position means moving the triangular geometric shape around by selecting different XY coordinates for the triangular geometric shape and comparing the binary values of the binary image lying within the area of the triangular geometric shape at each of the selected XY coordinates, the angular position of the respective pointer member being determined as the angular orientation of the triangular geometric shape wherein a maximum number of the binary values are found having the first value representative of an exposure below the threshold value.

18. An apparatus in accordance with claim 12, wherein the control means includes means for transmitting the binary image of the meter stages to a remote site for visual display at the remote site, whereby the meter image can be visually monitored and analyzed.

19. An optical sensor apparatus for reading a meter having one or more indicators representative of the meter reading; comprising:
  a. light source means for providing a source of light, the light source means directing the light generally toward a faceplate of the meter;
  b. lens means for focusing the light reflected off the meter faceplate;
  c. optically sensitive image detector means for receiving the light focused thereon by the lens means including an array of light sensitive elements; and
  d. control means operatively interconnected to the image detector means for receiving signals from the image detector means representative of the light intensity to which the light sensitive elements of the image detector means are exposed and for creating a digitized image of the meter faceplate based on the signals received from the image detector means, said control means further including storage means for storing the digitized image of the meter faceplate, said control means including shutter means for controlling the exposure of the image detector means to the reflected light.

20. An apparatus in accordance with claim 19, wherein said control means further includes pattern recognition means for interpreting the meter readout represented by the digitized image stored in the storage means, the control means being operatively interconnected to transmission means for transmitting the digitized image to a remote location.

* * * * *